US009269679B2

(12) United States Patent
Teng et al.

(10) Patent No.: US 9,269,679 B2
(45) Date of Patent: Feb. 23, 2016

(54) WAFER LEVEL PACKAGING TECHNIQUES

(71) Applicant: Taiwan Semiconductor Manufacturing Co., Ltd., Hsin-Chu (TW)

(72) Inventors: Yi-Chuan Teng, Zhubei (TW);
Jung-Huei Peng, Jhubei (TW);
Shang-Ying Tsai, Pingzhen (TW);
Li-Min Hung, Longtan Township (TW);
Yao-Te Huang, Hsinchu (TW); Chin-Yi Cho, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 51 days.

(21) Appl. No.: 14/072,141

(22) Filed: Nov. 5, 2013

(65) Prior Publication Data
US 2015/0123129 A1    May 7, 2015

(51) Int. Cl.
*H01L 21/66* (2006.01)
*H01L 23/00* (2006.01)
*B81C 99/00* (2010.01)

(52) U.S. Cl.
CPC ............ *H01L 24/06* (2013.01); *B81C 99/005* (2013.01); *H01L 24/94* (2013.01); *H01L 22/32* (2013.01); *H01L 2224/0605* (2013.01); *H01L 2924/01322* (2013.01)

(58) Field of Classification Search
CPC .............. H01L 22/34; H01L 22/32; H01L 2924/01079; H01L 2924/14; G01R 31/2884
See application file for complete search history.

(56) References Cited

U.S. PATENT DOCUMENTS

| | | | |
|---|---|---|---|
| 7,781,250 B2 | 8/2010 | Wang et al. | |
| 8,232,614 B1 * | 7/2012 | Chu et al. | 257/414 |
| 8,508,039 B1 * | 8/2013 | Nasiri et al. | 257/704 |
| 2005/0029666 A1 * | 2/2005 | Kurihara et al. | 257/772 |
| 2006/0208326 A1 * | 9/2006 | Nasiri et al. | 257/414 |
| 2009/0057868 A1 | 3/2009 | Wang et al. | |
| 2010/0044857 A1 | 2/2010 | Shao et al. | |
| 2010/0258950 A1 * | 10/2010 | Li et al. | 257/777 |
| 2012/0115305 A1 * | 5/2012 | Peng et al. | 438/455 |
| 2014/0327150 A1 * | 11/2014 | Jung et al. | 257/774 |

* cited by examiner

*Primary Examiner* — Lex Malsawma
*Assistant Examiner* — Long Le
(74) *Attorney, Agent, or Firm* — Eschweiler & Associates, LLC

(57) ABSTRACT

In a wafer level chip scale packaging technique for MEMS devices, a deep trench is etched on a scribe line area between two CMOS devices of a CMOS substrate at first. After bonding of the CMOS substrate with a MEMS substrate, the deep trench is opened by thin-down process so that CMOS substrate is singulated while MEMS substrate is not (partial singulation). Electrical test pad on MEMS substrate is exposed and protection material can be filled through the deep trench around bonding layers. After filling the protection material, the wafer is diced to form packaged individual chips with protection from environment outside bonding layer.

20 Claims, 18 Drawing Sheets

WAFER LEVEL PACKAGING TECHNIQUES

BACKGROUND

Wafer level chip scale packaging (WLCSP) is a packaging method where a semiconductor wafer is packaged and tested at the wafer level, and then later diced into individual chip size packages. This method decreases package size, reduces production cycle, and reduces cost compared to traditional methods where wafers are diced into individual chips which are separately tested and packaged.

WLCSP is conventionally used to manufacture and package complementary metal oxide semiconductor (CMOS) integrated circuits (ICs), but has not been widely deployed in packaging of Micro-electromechanical Systems (MEMS).

BRIEF DESCRIPTION OF THE DRAWINGS

FIGS. 10a-10c illustrate a top view and cross-sectional side view of a semiconductor wafer.

DETAILED DESCRIPTION

Figure 1A:
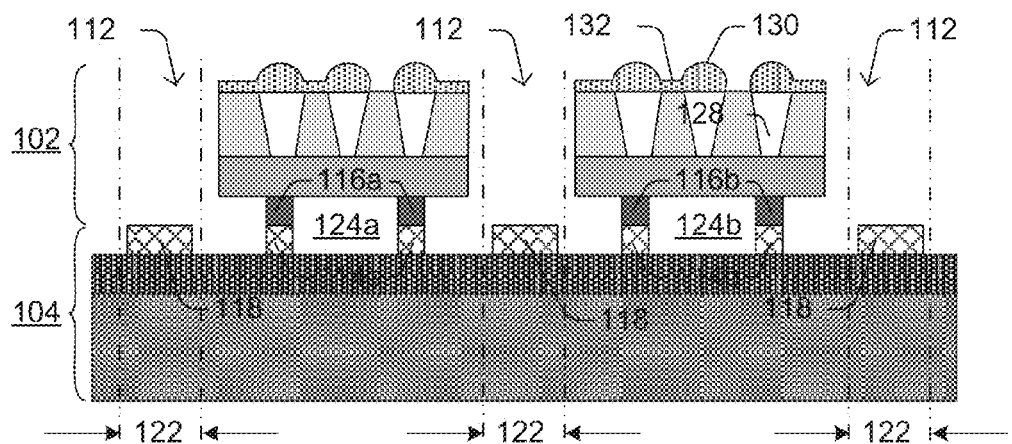
FIG. 1A illustrates a cross-sectional view of a wafer level package structure prior to formation of a protective layer and prior to dicing, in accordance with some embodiments.
Figure 1B:
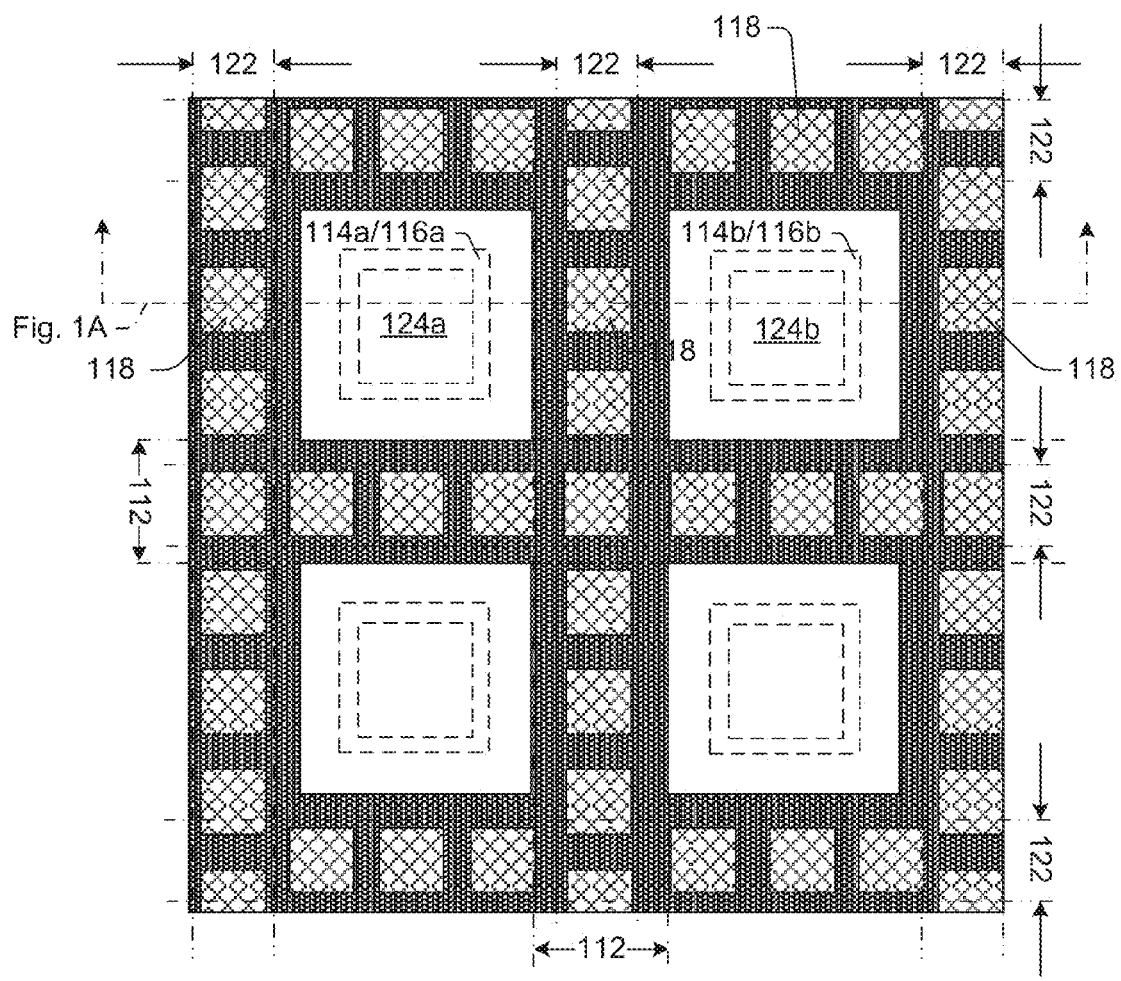
FIG. 1B illustrates a top-sectional view of the wafer level package structure of FIG. 1A in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Although WLCSP has been used for CMOS wafers, WLCSP presents several challenges for integration of CMOS wafers and MEMS wafers and/or for other types of wafers. For example, some MEMS devices, such as inertial sensors for example, need hermetic sealing, while other MEMS devices need a low pressure environment. Still other MEMS devices need a cavity that is large enough to allow for moving parts, which may need protection from environmental conditions such as humidity and dust. CMOS wafers do not require these types of features. In view of this, the present disclosure presents WLCSP techniques where a MEMS wafer is bonded to a CMOS wafer. To make this process efficient in some embodiments, for example, a deep trench can be etched into a CMOS substrate at a scribe line region between two neighboring CMOS dies. The deep trench is aligned to an underlying test structure on the MEMS wafer, wherein the underlying test structure is also arranged in a scribe line region between two neighboring MEMS dies. Hence, after the CMOS and MEMS wafers are bonded, the deep trench can be opened to expose the test structure to allow for testing of the bonding structure. After testing, a protective material can fill the deep trench to provide protection from environment. After the deep trench has been filled, the bonded wafers can be diced along scribe lines to form individual integrated circuits, which are already packaged and ready for customer shipment.

Figure 10C:
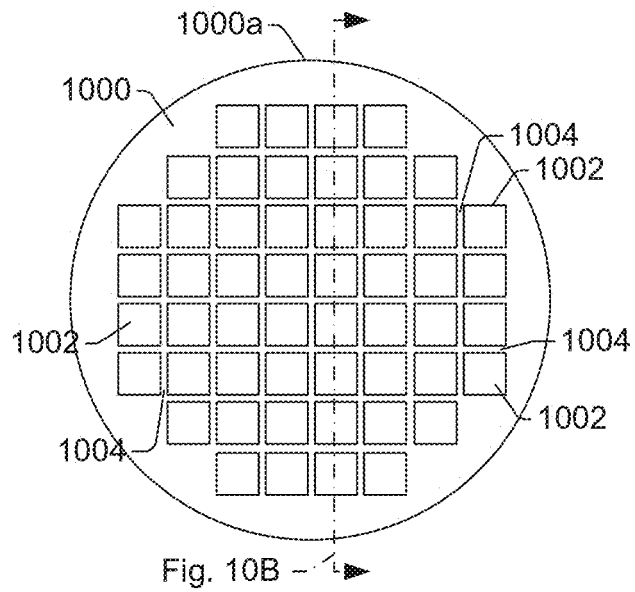
Figure 10C:
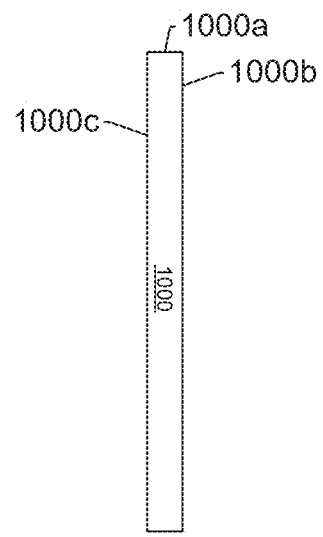
Figure 10C:
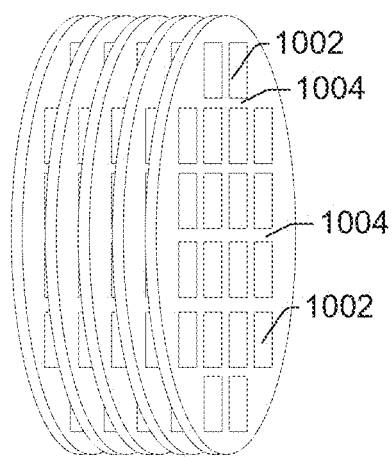

For reference, FIGS. 10A-10B show a semiconductor wafer 1000 that includes a number of die 1002. FIGS. 10A-10B's wafer 1000 has a circumferential edge 1000a that bounds first and second wafer faces 1000b, 1000c. Semiconductor devices or MEMS devices can be built on the individual dies 1002. After the fabrication process is complete (or nearly complete) for multiple wafers, the wafers are bonded ("stacked") on top of one another, as shown in FIG. 10C. The bonded wafers are then cut along scribe lines 1004 between neighboring dies, such that each die corresponds to a separate integrated circuit with multiple substrates. This general process is referred to as "wafer level packaging."

FIG. 1A illustrates a cross-sectional view of a wafer level package structure 100 in accordance with some embodiments. In this illustrated embodiment, two wafers (i.e., a first wafer represented as a first substrate 102, and a second wafer represented as a second substrate 104) are "stacked" on top one another. It will be appreciated, however, that although FIG. 1A shows only two wafers, in other embodiments additional wafers, such as three, four, five, etc., can be stacked on top of one another.

In FIG. 1A's example, the first substrate 102 includes a plurality of CMOS devices, and the second substrate 104 includes a plurality of MEMS devices. The first substrate 102 includes neighboring CMOS bond rings 116a, 116b with a scribe line 122 running there between. The second substrate 104 includes neighboring MEMS bond rings 114a, 114b, which also have scribe line 122 running there between. In some embodiments, for example, the MEMS bond rings 114 and the CMOS bond rings 116 could comprise material selected from a group consisting of indium, gold, tin, copper, aluminum, germanium and combinations thereof.

Each MEMS bond ring is arranged to surround a periphery of one or more MEMS devices, which are to be hermetically isolated from the ambient environment at the end of manufacturing. The CMOS bond rings 116 and MEMS bond rings 114, form cavities 124a, 124b between the first and second substrates and help affix the first substrate 102 to the second substrate 104. Each of these cavities 124 is in fluid communication with one or more MEMS devices on the second substrate 104, and can be filled with an inert gas or some other type of gas, which can exert an ambient pressure or a high or low pressure to walls of the cavity 124. An electrical interconnect structure is formed on a top side of the first substrate to provide electrical connection to a CMOS device on the first substrate 102 from the top side of the first substrate. The electrical interconnect structure can take the form of a through silicon via 128, a ball grid array 130, or a re-distribution layer 132, among others.

To provide testing of one or more MEMS devices (and also possibly one or more CMOS devices, in some instances in conjunction with a MEMS device), a test line 118 is arranged on the second substrate between two neighboring dies outside the MEMS bond ring 114. An open deep trench 112 is formed on a scribe line area 122 of the first substrate between two neighboring dies (a first die 123 and a second die 133). This open deep trench 112 allows a test probe or other testing device to come into electrical contact with the test line 118 during manufacturing, so that tests can be carried out at intermediate manufacturing stages before manufacturing is complete. This allows the manufacturing process to be accurately characterized so problems can be quickly identified and resolved. It also allows faulty wafers to disposed of early in the manufacturing process to help improve overall fabrication throughput.

Figure 2:
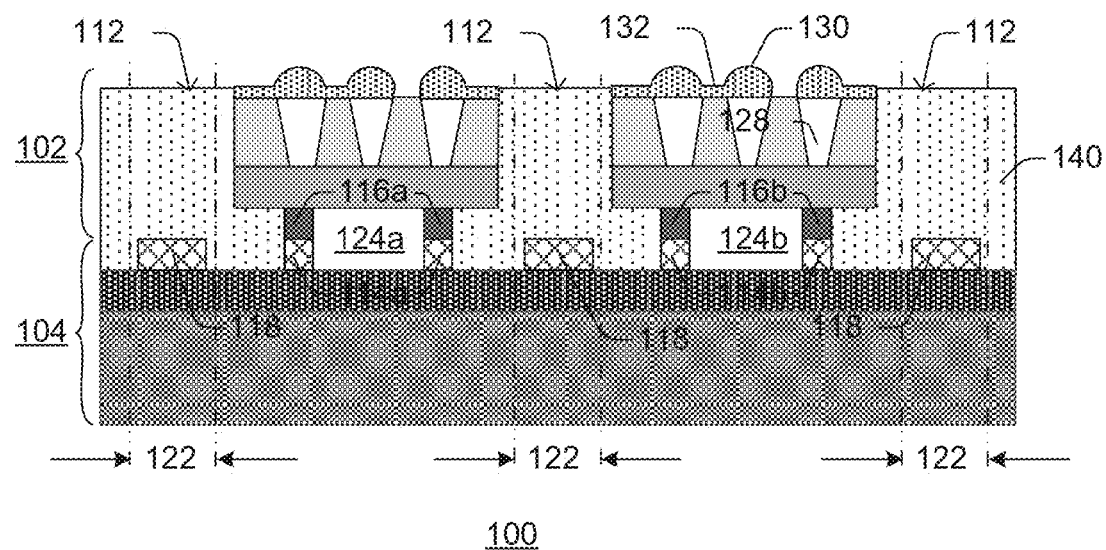
FIG. 2 illustrates a cross-sectional view of a wafer level package structure after formation of a protective layer but prior to dicing.

As shown in FIG. 2, prior to FIG. 1A's structure 100 being diced, the opened trench 112 is filled with a protective material 140. The protective material 140 can be photo resist, polyimide, epoxy, spin-on-glass material or a molding material.

Figure 3:
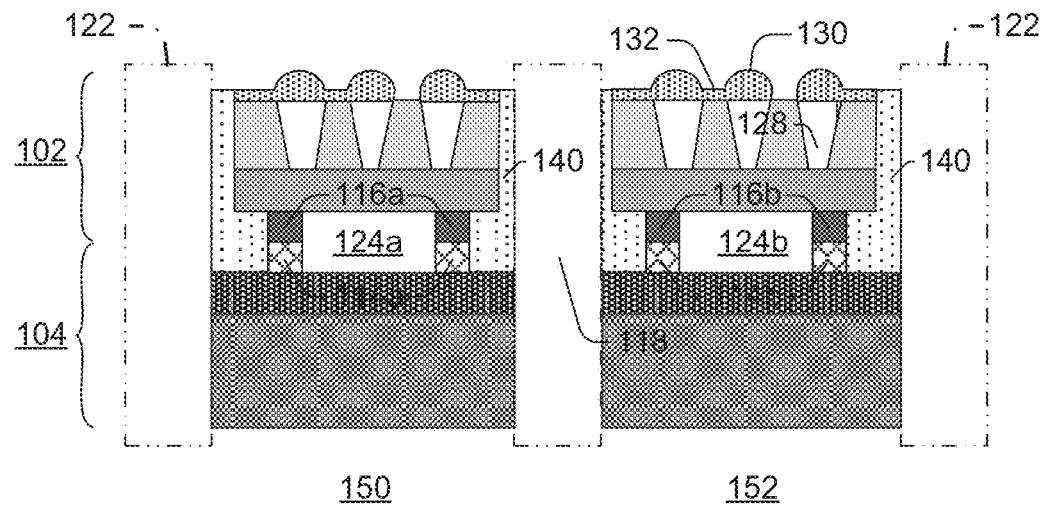
FIG. 3 illustrates a cross-sectional view of a wafer level package structure after dicing.

As shown in FIG. 3, after the opened trench 118 has been filled with protective material 140 (as previously depicted in FIG. 2), the wafer can be diced along the scribe lines resulting in a number of separate ICs (e.g., 150, 152). Notably, this process helps to form a number of discrete ICs in an economical manner and allows integration of CMOS devices and MEMS devices. This process allows for intermediate structures in the manufacturing process to be tested, and provides a compact, area-efficient final package.

Figure 4A:
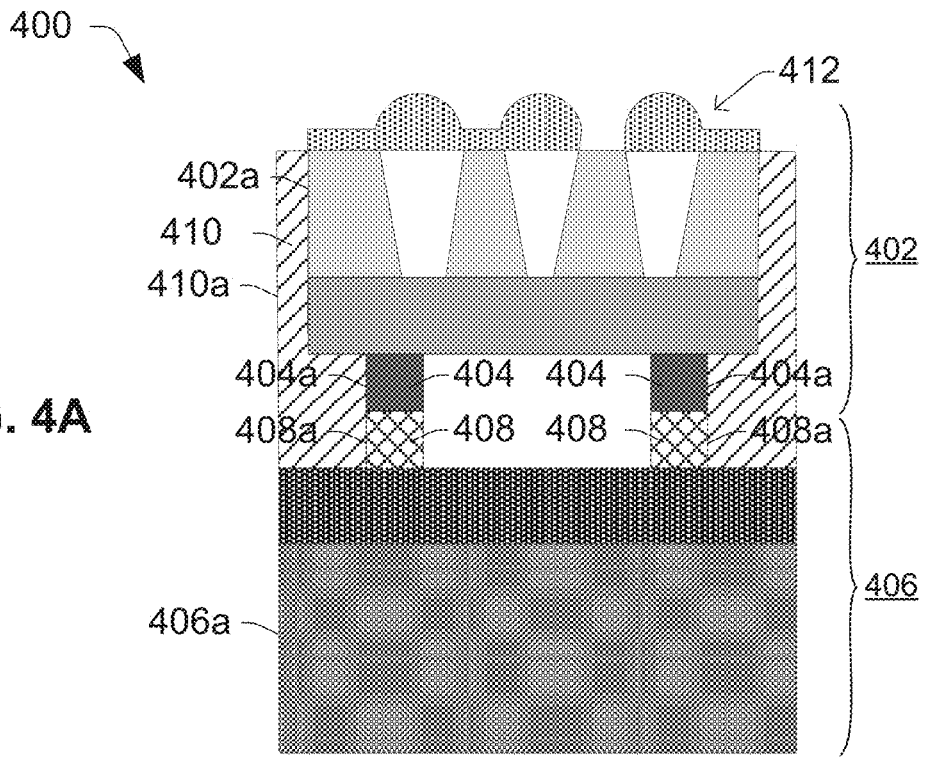
FIG. 4A illustrates a cross-sectional view of a MEMS packaged system in accordance with some embodiments.

FIG. 4A illustrates a cross-sectional view of a packaged IC structure 400 in accordance with some embodiments. This structure 400 includes a first substrate 402 comprising a CMOS device and a CMOS bond ring 404, and also includes a second substrate 406 comprising a MEMS device and a MEMS bond ring 408. The MEMS bond ring 408 surrounds a periphery of the MEMS device and is bonded to the CMOS bond ring 404. For example, a eutectic metal bond or a eutectic Ga/Al bond can bond the CMOS bond ring 404 to MEMS bond ring 408. A protection layer 410 covers outer sidewalls 404a of the CMOS bond ring 404 and outer sidewalls 408a of the MEMS bond ring 408. The protection layer 410 also covers an outer sidewall 402a of the first substrate and does not cover an outer sidewall 406a of the second substrate. The outer sidewall 406a of the second substrate meets an outer sidewall 410a of the protection layer to define a planar surface at which the packaged IC structure was diced. An electrical interconnect structure 412, which is arranged on a top surface of the first substrate 402, can allow electrical contact to one or more CMOS devices (and or one or more MEMS devices) form the top surface.

Figure 4B:
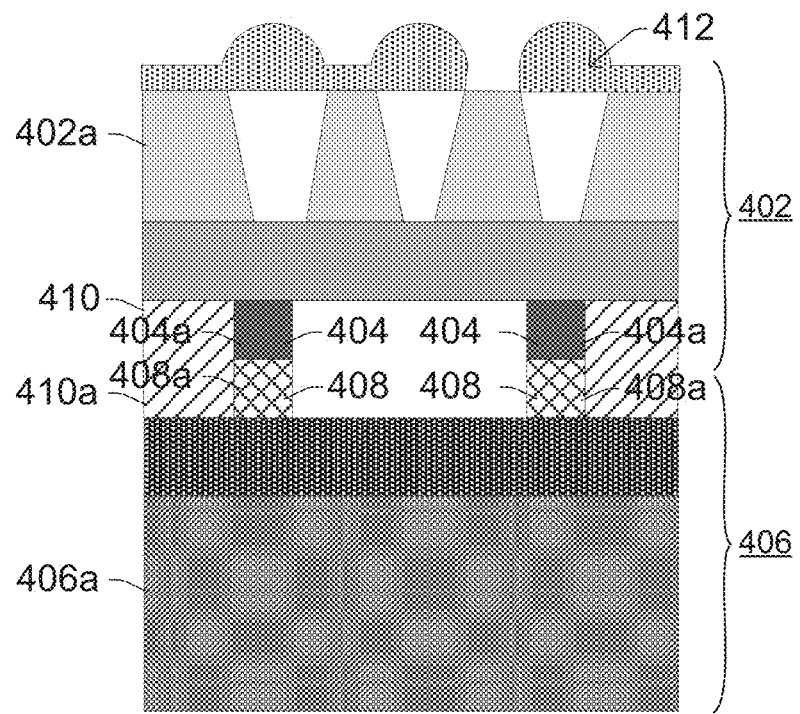
FIG. 4B illustrates a cross-sectional view of a MEMS packaged system in accordance with some alternative embodiments.

FIG. 4B illustrates a cross-sectional view of a MEMS packaged system in accordance with some alternative embodiments. Besides the similarity to the structure of FIG. 4A above, in the embodiments of FIG. 4B, outer sidewalls 402a of the first substrate 402 are not covered by the protection layer 410. Instead, the outer sidewalls 402a are aligned to outer sidewalls 406a of the second substrate 406. Structures of FIG. 4A and FIG. 4B are formed by choosing dicing position during a previous singulation step.

Figure 5:
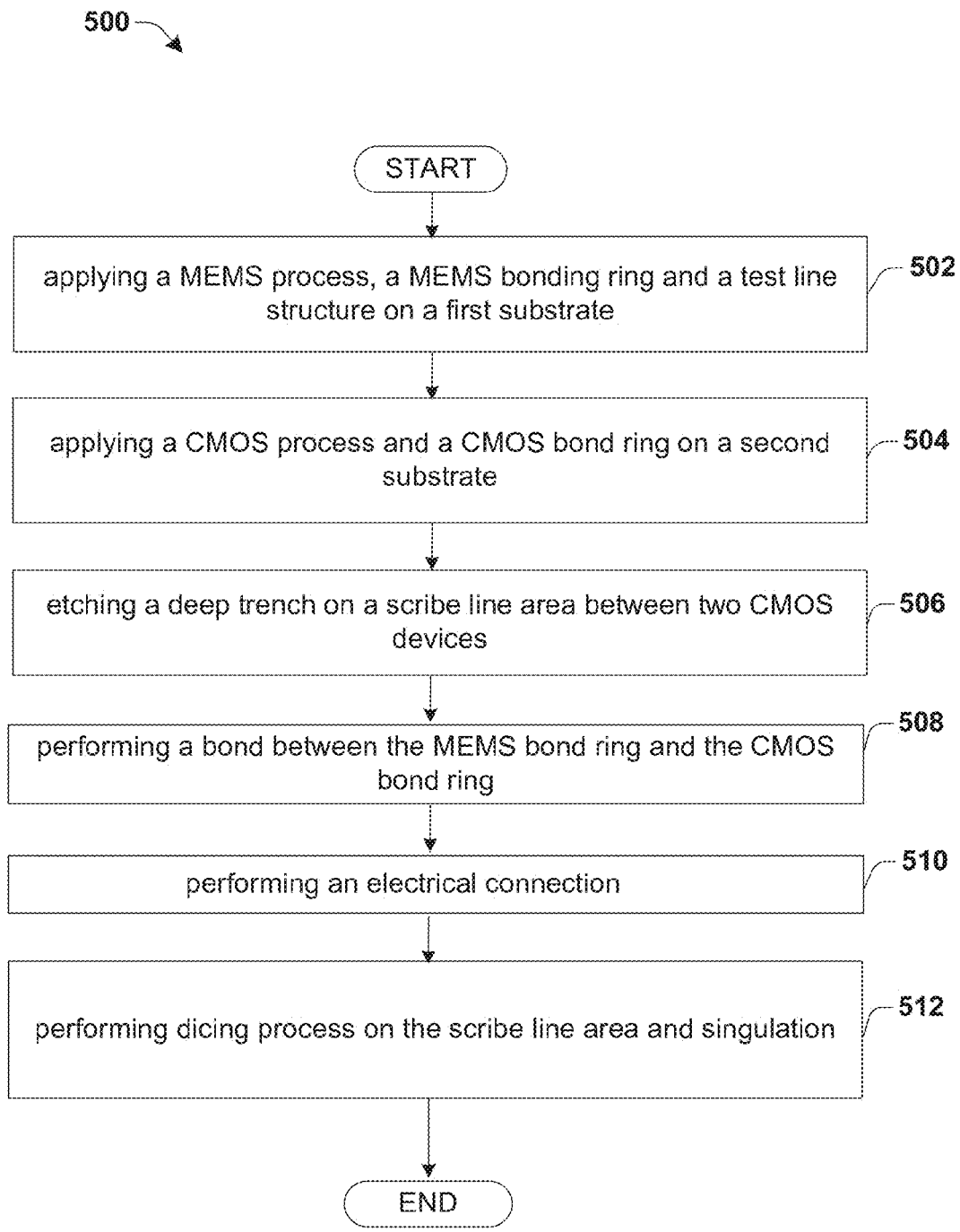
FIGS. 5-6 illustrate flow diagrams of some embodiments of methods for fabricating a MEMS wafer level chip scale package.

FIG. 5 illustrates a flow diagram of a method for fabricating a MEMS wafer level chip scale package in accordance with some embodiments. While disclosed methods (e.g., methods 500 of FIG. 5 and 600 of FIG. 6) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a MEMS process, a MEMS bond ring and a test line structure are applied on a first substrate. The bond ring is either continuous circle ring, rectangular ring or a series of non-continuous pads.

At 504, a CMOS process and a CMOS bond ring are applied on a second substrate.

At 506, a deep trench in a scribe line area between two CMOS devices is etched.

At 508, a bond between the MEMS bond ring and the CMOS bond ring is performed. The bond is eutectic metal bond.

At 510, an electrical connection is formed on a top side of the second substrate. The electrical connection is formed by through silicon via, ball grid array, or re-distribution layer.

Figure 6:
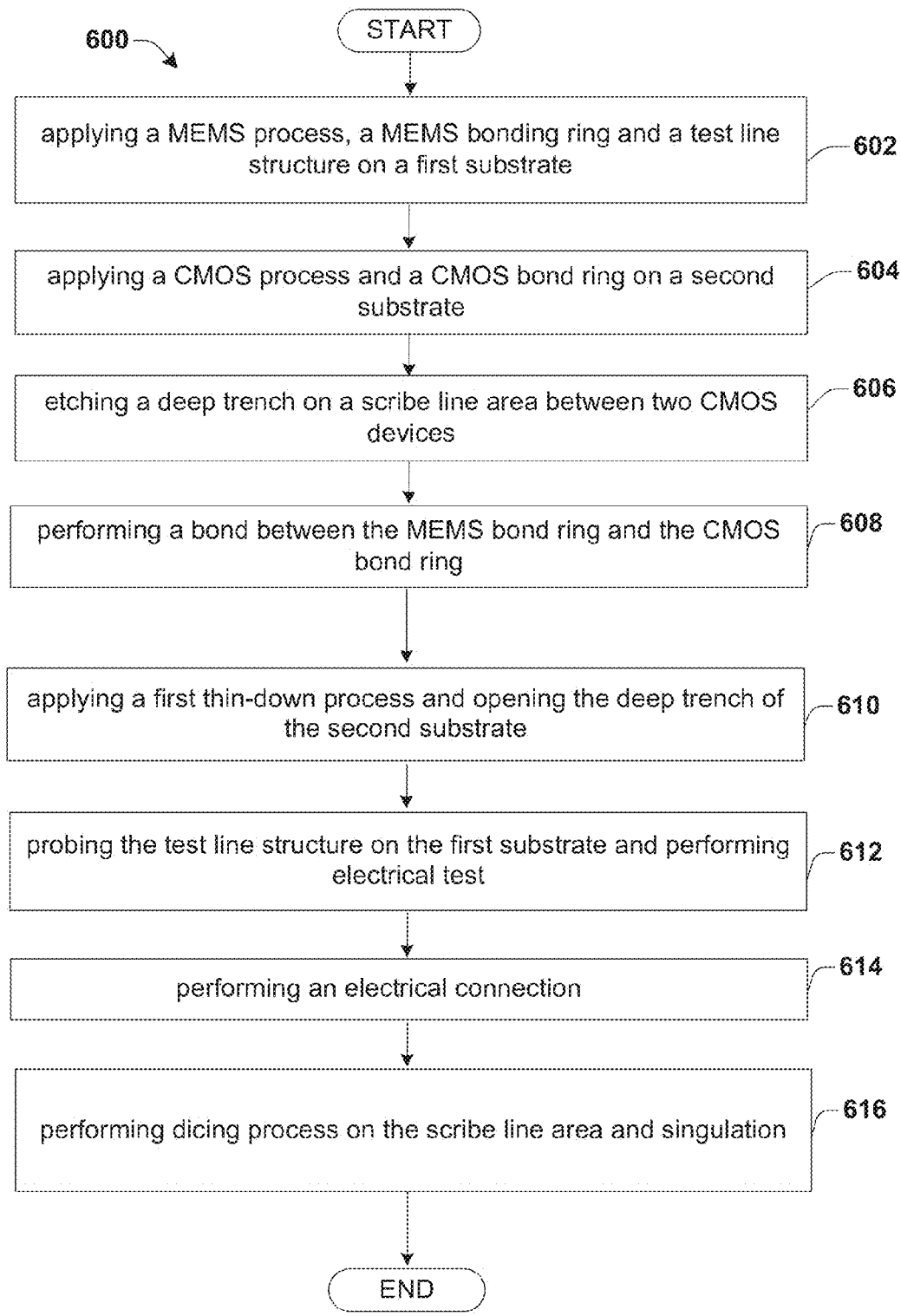

At 512, a singulation process is performed on the scribe line area. The singulation is realized by dicing at the scribe line area FIG. 6 illustrates a flow diagram of some embodiments of a method 600 for fabricating a MEMS wafer level chip scale package. The method 600 performs an electrical test to confirm bonding process prior to forming an electrical connection on a top side of the second substrate (CMOS substrate).

At 602, a MEMS process, a MEMS bond ring and a test line structure are applied on a first substrate. The bond ring is either continuous circle ring, rectangular ring or a series of non-continuous pads.

At 604, a CMOS process and a CMOS bond ring are applied on a second substrate.

At 606, a deep trench in a scribe line area between two CMOS devices is etched.

At 608, a bond between the MEMS bond ring and the CMOS bond ring is performed. The bond is eutectic metal bond, for example, a eutectic Al/Ge bond.

At 610, a first thin-down process is applied and the deep trench is opened. The first thin-down process is applied by grinding a top side of the second substrate.

At 612, an electrical test is performed to confirm bonding connection. The electrical test is performed by probing the test line structure on the first substrate through opening of the deep trench.

At 614, an electrical connection is formed on a top side of the second substrate. The electrical connection is formed by through silicon via, ball grid array, or re-distribution layer.

At 616, a singulation process is performed on the scribe line area. The singulation is realized by dicing at the scribe line area.

One example of FIG. 6's method is now described with regards to a series of cross-sectional views as shown in FIGS. 7a-7g. Although 7a-7g are described in relation to method 600, it will be appreciated that the structures disclosed in FIGS. 7a-7g are not limited to such a method, but instead may stand alone as a structure.

Figures 1, 7A:
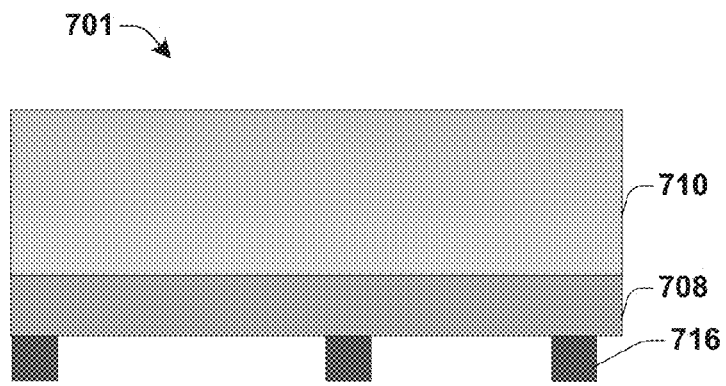
FIGS. 7a-7g illustrate cross-sectional views of some embodiments of a method of fabricating a MEMS wafer level chip scale package.
Figures 2, 7A:
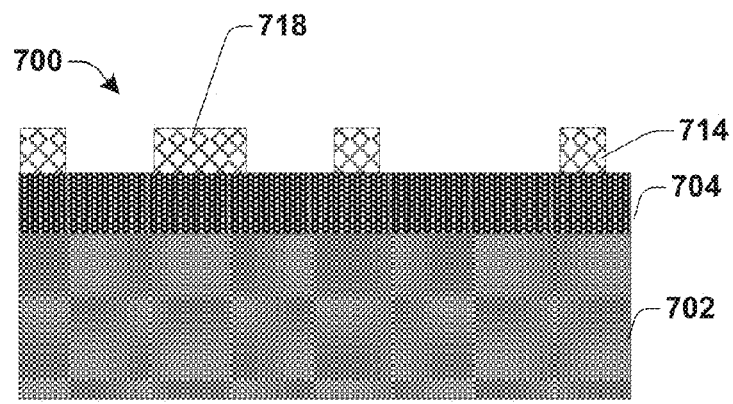

At FIG. 7a-2, a MEMS process 704, a MEMS bond ring 714 and a test line structure 718 are applied on a first substrate 702.

At FIG. 7a-1, a CMOS process 708 and a CMOS bond ring 716 are applied on a second substrate 710.

Figure 7B:
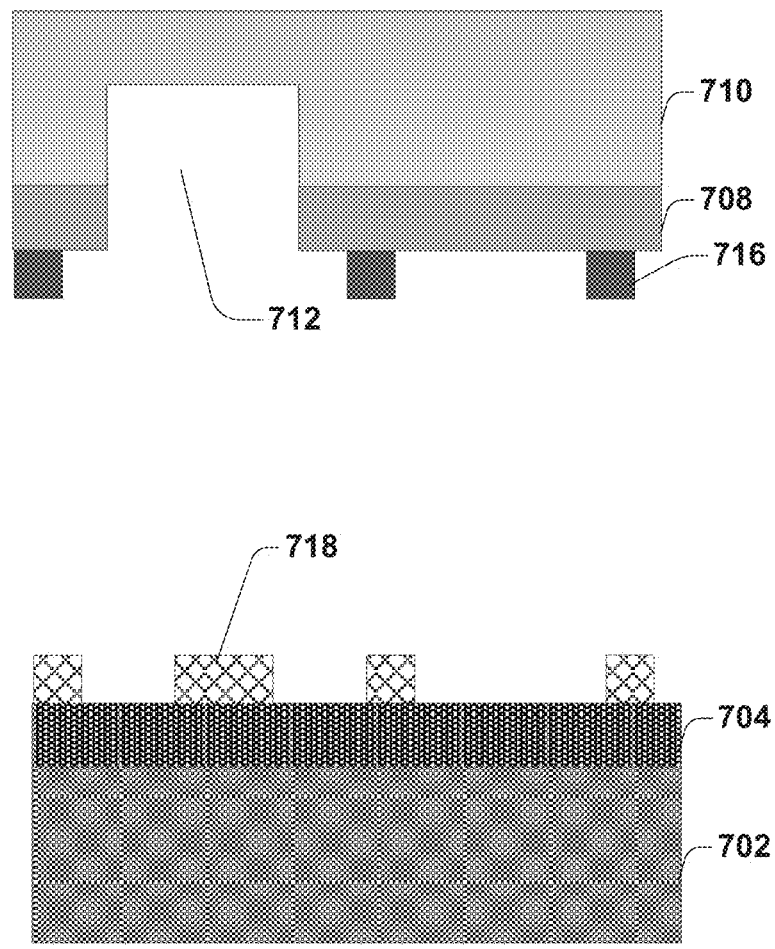

At FIG. 7b, a deep trench 712 is etched in a scribe line area 722 between two CMOS devices.

Figure 7C:
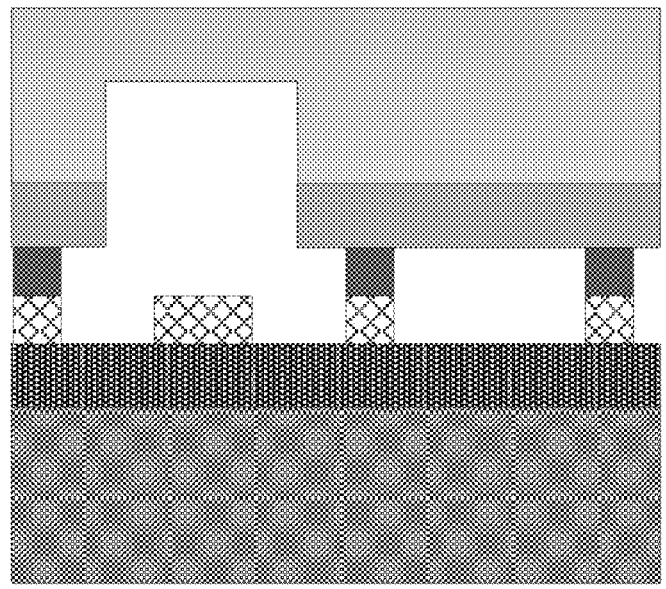

At FIG. 7c, a bond between the MEMS bond ring 714 and the CMOS bond ring 716 is performed. The test line structure 718 is aligned with the deep trench 712.

Figure 7D:
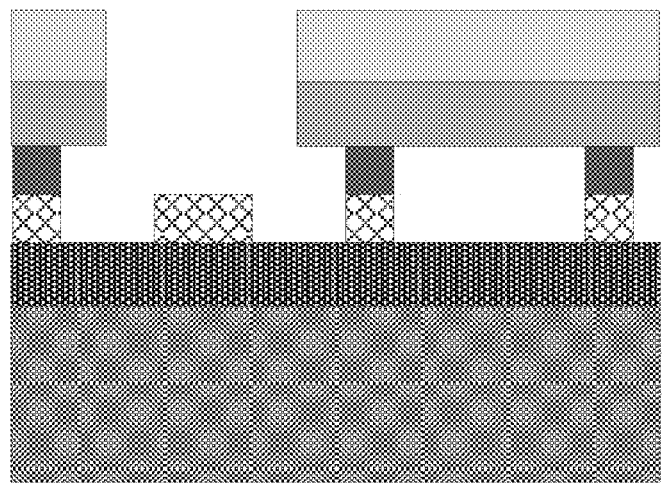

At FIG. 7d, a first thin-down process is applied and the deep trench is opened. At this point, partial singulation of a wafer is formed. Possible crack happened in followed processes on one chip do not extend to rest of the wafer.

Figure 7E:
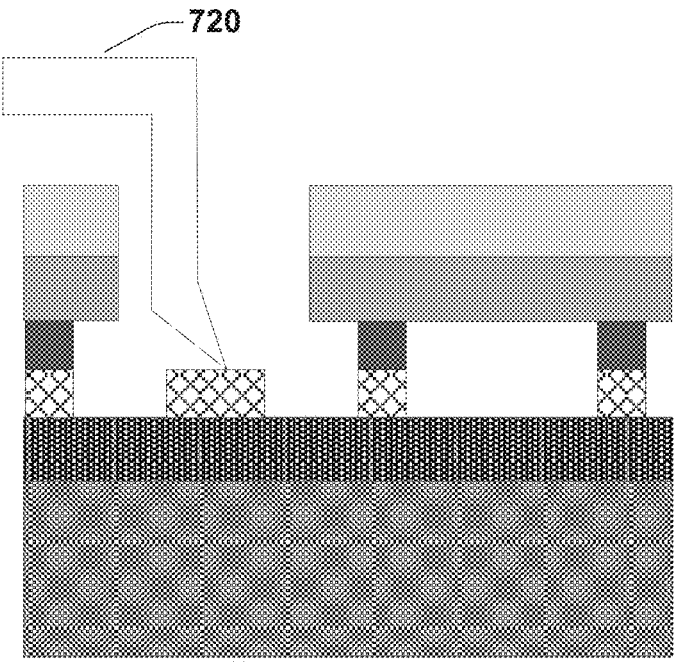

At FIG. 7e, an electrical test is performed to confirm bonding connection. The electrical test is performed by probing the test line structure on the first substrate through opening of the deep trench. An automatic probe system 720 is used to perform programmable automatic test.

Figure 7F:
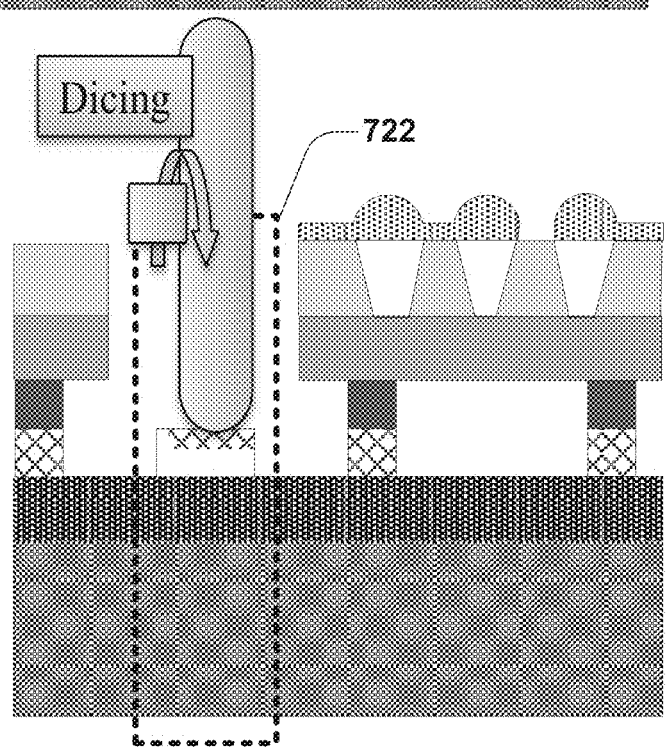

At FIG. 7f, an electrical connection structure 731 is formed on a top side of the second substrate. Then, a singulation process is performed on the scribe line area 722. The singulation is realized by dicing on the scribe line area.

Figure 7G:
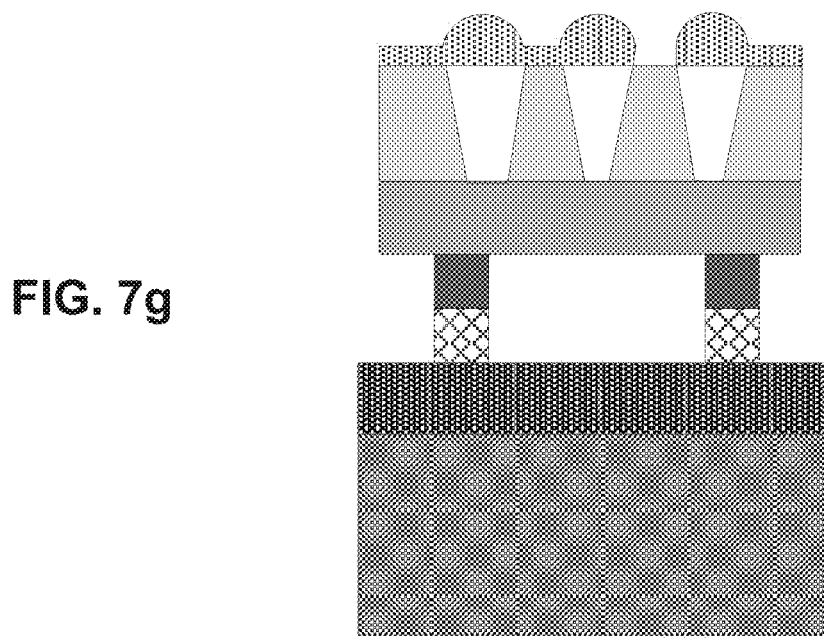

At FIG. 7g, an example of resulted MEMS system is shown.

Figure 8:
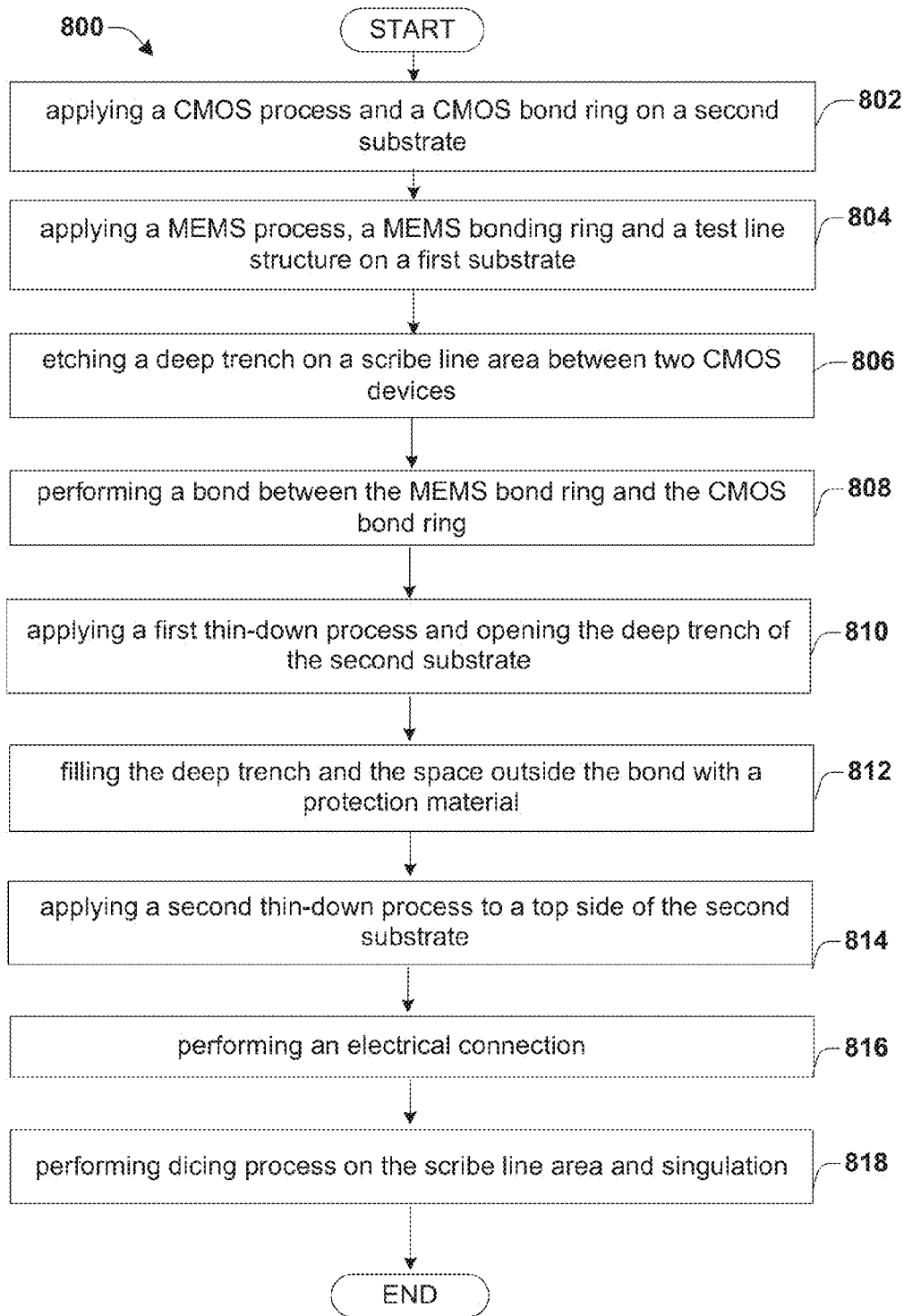
FIG. 8 illustrates a detailed flow diagram of some alternative embodiments of a method for fabricating a MEMS wafer level chip scale package.

FIG. 8 illustrates a flow diagram of some alternative embodiments of a method 800 for fabricating a MEMS wafer level chip scale package. The method 800 provides additional protection for bonding layer on a wafer level.

At 802, similar to at 602, a MEMS process, a MEMS bond ring and a test line structure are applied on a first substrate.

At 804, similar to at 604, a CMOS process and a CMOS bond ring are applied on a second substrate.

At 806, similar to at 606, a deep trench in a scribe line area between two CMOS devices is etched.

At 808, similar to at 608, a bond between the MEMS bond ring and the CMOS bond ring is performed. A cavity is formed inside the bond and a space is formed outside the bond.

At 810 similar to at 610, a first thin-down process is applied and the deep trench is opened.

At 812, a protection material is filled into the deep trench and the space outside the bond.

At 814, a second thin-down process is applied to a top side of the second substrate to remove partial of the protection material on the device area and flat top surface.

At 816, similar to 614, an electrical connection is formed on a top side of the second substrate. The electrical connection is formed by through silicon via, ball grid array, or re-distribution layer.

At 818, similar to 616, a singulation process is performed on the scribe line area. The singulation is realized by dicing at the scribe line area.

One example of FIG. 8's method is now described with regards to a series of cross-sectional views as shown in FIGS. 9a-9i.

At FIG. 9a-1, FIG. 9a-2 and FIG. 9b, a MEMS process 904, a MEMS bond ring 914 and a test line structure 918 are applied on a first substrate 902 while a CMOS process 908, a CMOS bond ring 916 and a deep trench 912 at a scribe line area 922 are applied on a second substrate.

Figures 1, 9A:
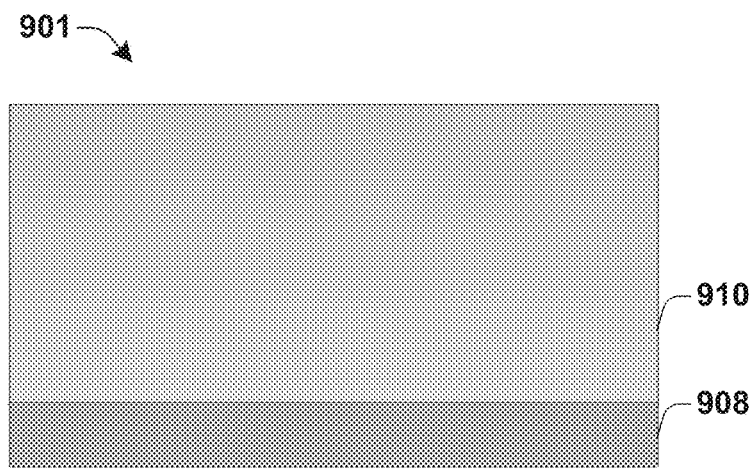
FIGS. 9a-9i illustrate cross-sectional views of some alternative embodiments of a method for fabricating a MEMS wafer level chip scale package.
Figures 2, 9A:
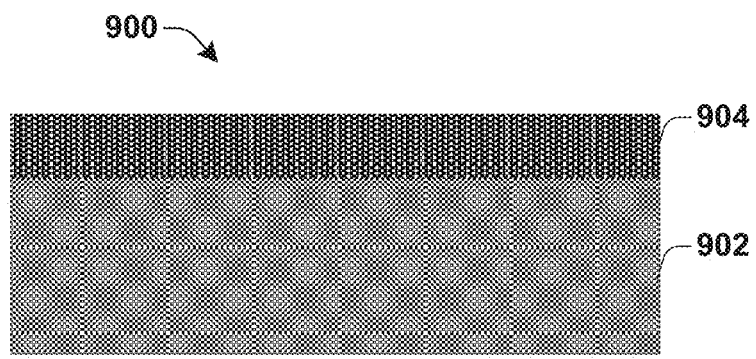
Figure 9B:
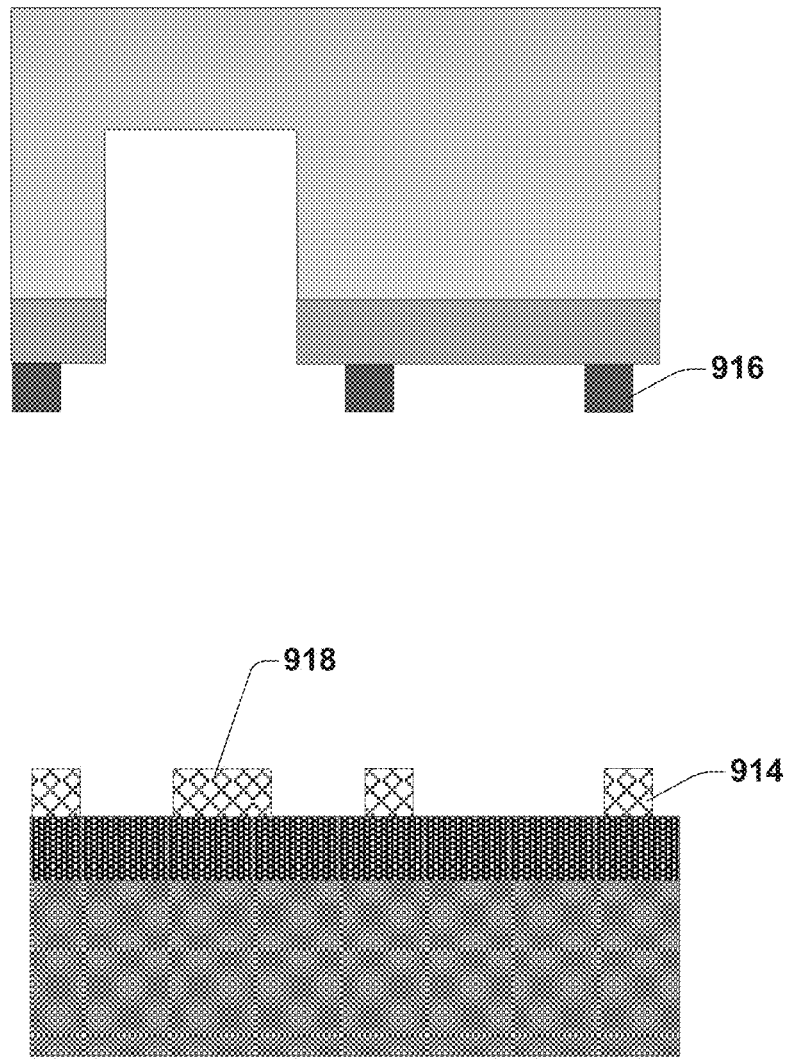
Figure 9C:
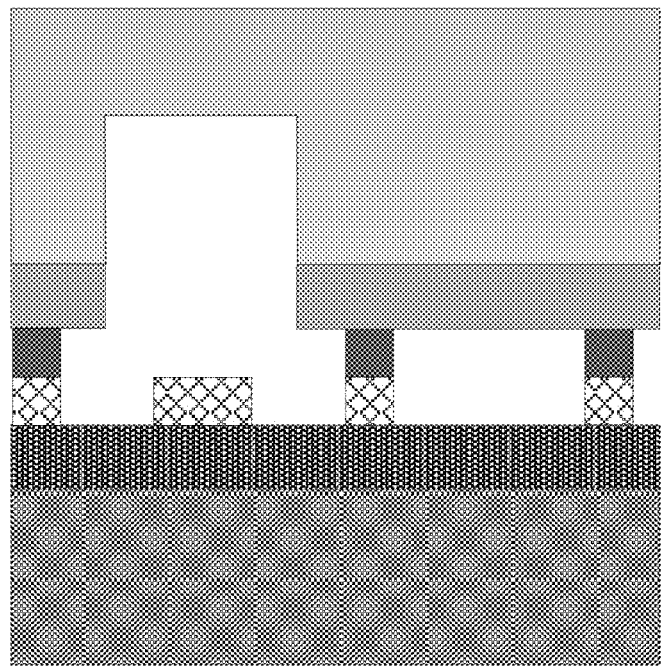

At FIG. 9c, a bond between the MEMS bond ring 914 and the CMOS bond ring 916 is performed. A cavity is formed inside the bond and a space is formed outside the bond.

Figure 9D:
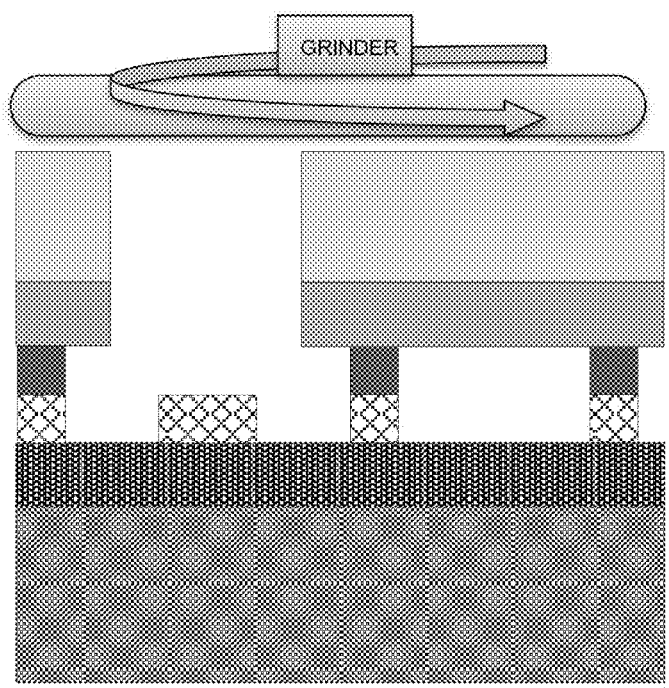

At FIG. 9d, a first thin-down process is applied and the deep trench 912 is opened.

Figure 9E:
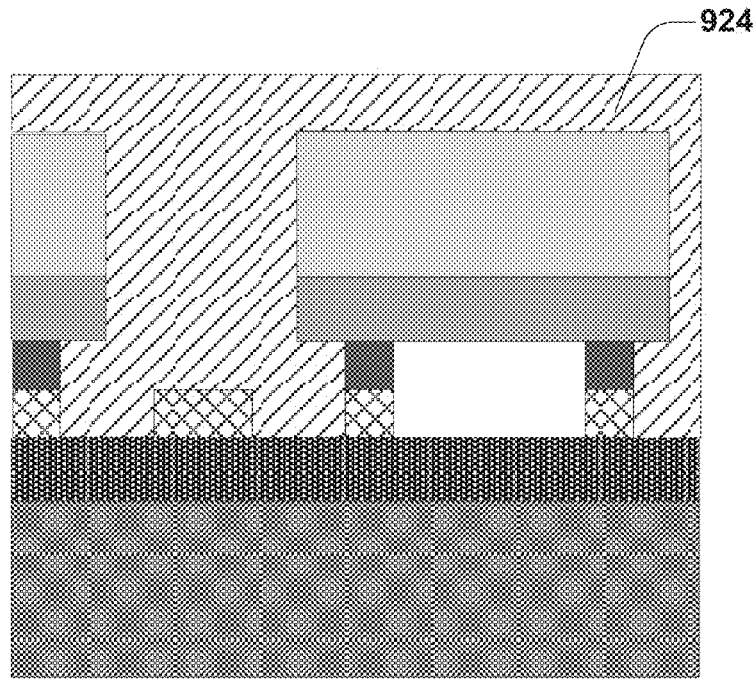

At FIG. 9e, a protection material is filled into the deep trench and the space outside the bond.

Figure 9F:
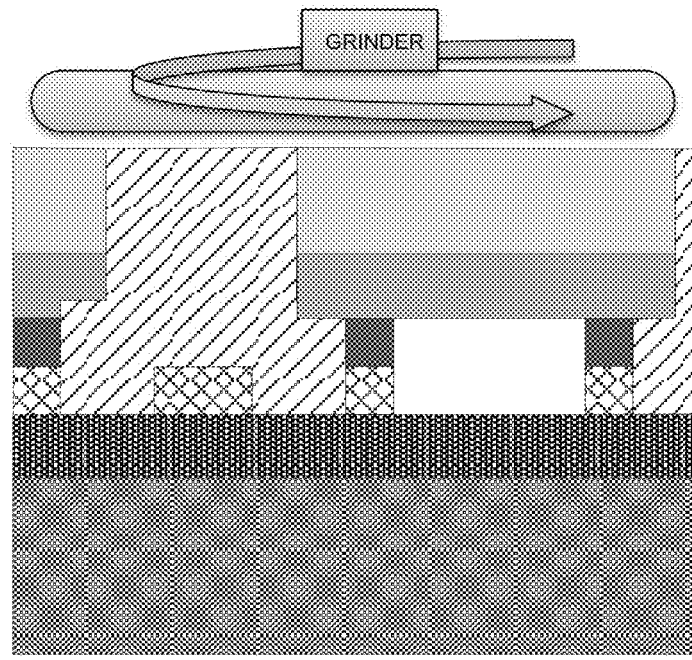

At FIG. 9f, a second thin-down process is applied to a top side of the second substrate to remove partial of the protection material on the device area 923 and flat a top surface 933.

Figure 9G:
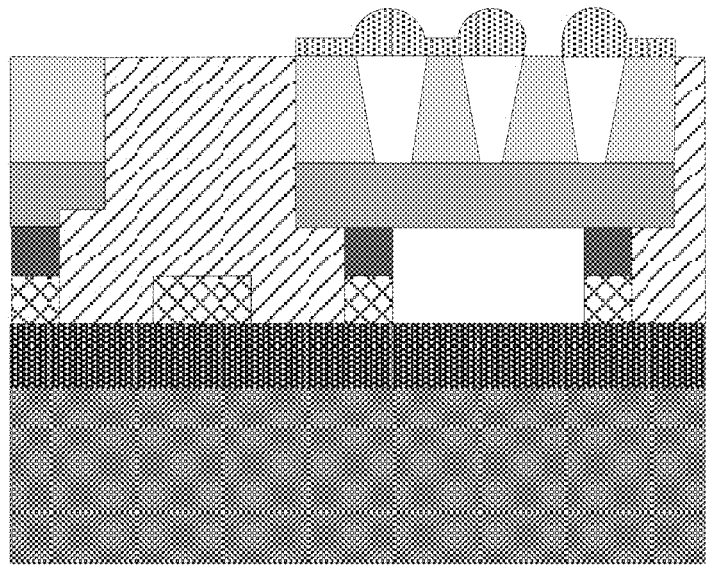

At FIG. 9g, an electrical connection structure 931 is formed on a top side of the second substrate.

Figure 9H:
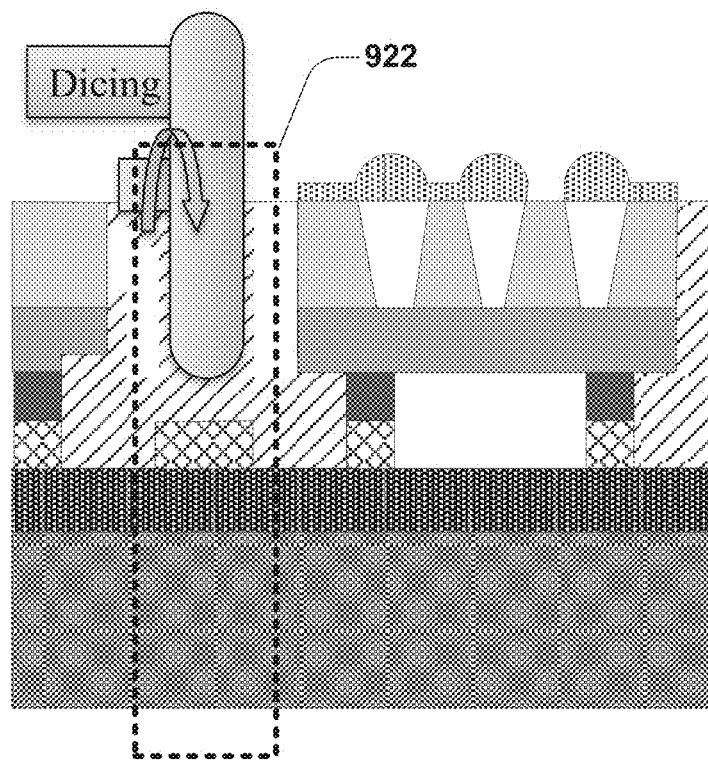

At FIG. 9h, a singulation process is performed on the scribe line area 922. A dicing process is performed to remove a part of the protection material in the scribe line area 922 and leave a proper part of protection material for protecting chips.

Figure 9I:
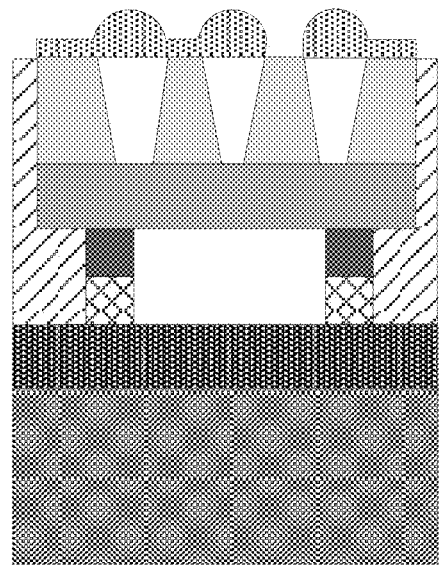

At FIG. 9i, an example of resulted MEMS system is shown.

Thus, some embodiments relate to a packaged integrated circuit (IC) structure. This structure includes a first substrate comprising a CMOS device and a CMOS bond ring, and also includes a second substrate comprising a MEMS device and a MEMS bond ring. The MEMS bond ring surrounds a periphery of the MEMS device and is bonded to the CMOS bond ring. A protection layer covers outer sidewalls of the MEMS bond ring and outer sidewalls of the CMOS bond ring. The protection layer also covers an outer sidewall of the first substrate and does not cover an outer sidewall of the second substrate.

Other embodiments relate to a wafer level package structure. This structure includes a first substrate, a second substrate, and an array of bond ring structures arranged between the first and second substrates. Interior sidewalls of a bond ring structure define a cavity between a first surface of the first substrate and a first surface of the second substrate. A test line is arranged on or proximate to the first surface of the second substrate. The test line is arranged in a scribe line area between opposing outer sidewalls of neighboring bond ring structures and is electrically coupled to a device on the second substrate.

Still other embodiments relate to a method. In this method, a first wafer, which includes a plurality of CMOS die and having CMOS bond rings associated therewith, is provided. CMOS scribe line regions are arranged between neighboring CMOS die. A deep trench is aligned within a CMOS scribe line region in the first substrate. A second wafer, which includes a plurality of MEMS die having MEMS bond rings associated therewith, is also provided. MEMS scribe line regions are arranged between neighboring MEMS die and correspond to the CMOS scribe line regions. A test line structure is aligned within a MEMS scribe line region on the second wafer. The first wafer is bonded to the second wafer by bonding the array of CMOS bond rings to the array of MEMS bond rings. The deep trench is aligned over the test line structure after bonding. The bonded first and second wafers are then diced along the CMOS and MEMS scribe line regions.

It will be appreciated that while reference is made throughout this document to exemplary structures in discussing aspects of methodologies described herein (e.g., the structure presented in FIGS. 7a-7g, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A packaged integrated circuit (IC) structure comprising:
   a first substrate comprising a CMOS device and a CMOS bond ring,
   a second substrate laterally extending across an outer sidewall of the first substrate, the second substrate comprising a MEMS device and a MEMS bond ring, the MEMS bond ring surrounding a periphery of the MEMS device and being bonded to the CMOS bond ring; and
   a protection layer covering outer sidewalls of the MEMS bond ring and outer sidewalls of the CMOS bond ring, and further covering the outer sidewall of the first substrate and not covering an outer sidewall of the second substrate;
   wherein the protection layer has an upper surface that is aligned with an upper surface of the first substrate.

2. The packaged IC structure of claim 1, wherein the outer sidewall of the second substrate meets an outer sidewall of the protection layer to define a planar surface at which the packaged IC structure was diced.

3. The packaged IC structure of claim 1, wherein the outer sidewalls of the MEMS bond ring and CMOS bond ring are laterally recessed relative to the outer sidewall of the first substrate.

4. The packaged IC structure of claim 1, wherein the MEMS bond ring and CMOS bond ring meet to form an enclosed cavity which is in fluid communication with the MEMS device and which is hermetically sealed from an ambient environment surrounding the packaged IC structure.

5. The packaged IC structure of claim 1, further comprising an electrical connection structure connecting the CMOS device to a top side of the first substrate, the top side opposing a bottom side of the first substrate on which the CMOS bond ring is arranged.

6. A wafer level package structure, comprising:
   a first substrate;
   a second substrate comprising a plurality of MEMS devices;
   an array of bond ring structures arranged between the first and second substrates, wherein interior sidewalls of a bond ring structure define a cavity between a first surface of the first substrate and a first surface of the second substrate; and
   a test line arranged on or proximate to the first surface of the second substrate, wherein the test line is arranged in a scribe line area between opposing outer sidewalls of neighboring bond ring structures and is electrically coupled to a MEMS device on the second substrate.

7. The wafer level package structure of claim 6, further comprising:
   a deep trench in the first substrate, wherein the deep trench is aligned in the scribe line area over the test line.

8. The wafer level package structure of claim 7, wherein the deep trench is filled with a protection material including photo resist, polyimide, epoxy, spin-on-glass material, or molding material.

9. The wafer level package structure of claim 6, wherein the cavity is filled with an inert gas.

10. The wafer level package structure of claim 6, wherein the first substrate comprises a plurality of CMOS devices.

11. The wafer level package structure of claim 10, wherein a bond ring structure comprises a CMOS bond ring on the first substrate and a MEMS bond ring on the second substrate.

12. The wafer level package structure of claim 11, wherein the MEMS bond ring is comprised of a material selected from a group consisting of indium, gold, tin, copper, aluminum, germanium and combinations thereof.

13. The wafer level package structure of claim 11, wherein the CMOS bond ring is comprised of a material selected from a group consisting of indium, gold, tin, copper, aluminum, germanium and combinations thereof.

14. The wafer level package structure of claim 11, wherein a bond between the MEMS bond ring and CMOS bond ring is a eutectic metal bond or a eutectic Al/Ge bond.

15. The wafer level package structure of claim 6, further comprising:
   a through silicon via, a ball grid array, or a re-distribution layer arranged on a top side of the first substrate to provide electrical connection from the top side of the first substrate.

16. A packaged integrated circuit (IC) structure comprising:
   a first bond ring arranged on a first substrate and laterally set back from an outer sidewall of the first substrate;
   a second bond ring arranged on a second substrate and bonded to the first bond ring to enclose a hermetic cavity therebetween, wherein the second bond ring is laterally set back from an outer sidewall of the second substrate;
   a protection layer abutting outer sidewalls of the first and second bond rings, and not abutting the outer sidewall of the second substrate; and
   a through silicon via extending from a to side of the first substrate to a position within the first substrate that vertically overlies the cavity.

17. The packaged IC structure of claim 16, wherein the outer sidewalls of the first and second substrates are vertically aligned with an outer sidewall of the protection layer.

18. The packaged IC structure of claim 16, wherein the second substrate has a lateral dimension that is greater than that of the first substrate.

19. The packaged IC structure of claim 16, wherein the protection layer has an upper surface that is co-planar with a top side of the first substrate.

20. The packaged IC structure of claim 16, wherein the first substrate is a CMOS substrate comprising a CMOS device and the second substrate is a MEMS substrate comprising a MEMS device, wherein the through silicon via is coupled to the CMOS device of the CMOS substrate.

* * * * *

UNITED STATES PATENT AND TRADEMARK OFFICE
CERTIFICATE OF CORRECTION

| | |
|---|---|
| PATENT NO. | : 9,269,679 B2 |
| APPLICATION NO. | : 14/072141 |
| DATED | : February 23, 2016 |
| INVENTOR(S) | : Yi-Chuan Teng et al. |

It is certified that error appears in the above-identified patent and that said Letters Patent is hereby corrected as shown below:

Claims

Column 8, Claim 16, Line 14 Please replace "…from a to side…" with --…from a top side…--

Signed and Sealed this
Third Day of May, 2016

Michelle K. Lee
*Director of the United States Patent and Trademark Office*